United States Patent

Ghilardelli et al.

[11] Patent Number: 6,097,213
[45] Date of Patent: Aug. 1, 2000

[54] SWITCHING CIRCUIT WITH AN OUTPUT VOLTAGE CHANGING AMONG FOUR POSSIBLE VALUES

[75] Inventors: Andrea Ghilardelli, Cinisello Balsamo; Carla Maria Golla, Sesto San Giovanni; Matteo Zammattio, Milan; Stefano Zanardi, Seriate, all of Italy

[73] Assignee: STMicroelectronics S.r.l., Italy

[21] Appl. No.: 09/275,691

[22] Filed: Mar. 24, 1999

[30] Foreign Application Priority Data

Mar. 27, 1998 [IT] Italy ................................. MI98A0640

[51] Int. Cl.⁷ .............................................. H03K 19/0948
[52] U.S. Cl. .................... 326/58; 326/68; 326/83
[58] Field of Search .................... 326/56–58, 83, 326/86, 112, 119, 121, 68, 80–81; 327/333

[56] References Cited

U.S. PATENT DOCUMENTS 5,054,001  10/1991  Guillot ....................................... 326/57
5,302,870  4/1994  Chern ........................................ 326/57
5,869,984  2/1999  Eto ............................................ 326/17

*Primary Examiner*—Jon Santamauro
*Attorney, Agent, or Firm*—Theodore E. Galanthay; E. Russell Tarleton; Seed Intellectual Property Law Group

[57] ABSTRACT

Switching circuit comprising a reference voltage, an input voltage, suitable to assume alternatively a negative value or a value equal to said reference voltage, an output node, suitable to assume selectively three possible voltage values equal to a supply voltage, to the reference voltage, to the input voltage or, alternatively, to be kept floating, in response to a first, a second, a third, a fourth, a fifth, a sixth control logic signal, switching between the supply voltage and the reference voltage.

16 Claims, 3 Drawing Sheets

| TAB.1 | VNEG=GND | | | VNEG<GND | | | |
|---|---|---|---|---|---|---|---|
| OUT | GND | VDD | HiZ | GND | VDD | HiZ | VNEG |
| v1 | 0 | 0 | 0 | 1 | 1 | 1 | 0 |
| v2 | 0 | 0/1 | 0/1 | 1 | 1 | 1 | 0→1 |
| v3 | 0 | 0 | 0 | 0 | 0 | 0 | 1 |
| v4 | 1 | 1/0 | 1/0 | 0→1 | 0→1 | 0→1 | 1 |
| v5 | 1 | 0 | 0 | 1 | 0 | 0 | 1 |
| v6 | 0 | 1 | 1 | 0 | 1 | 1 | 1 |
| v7 | 0 | 0 | 0 | 0→1 | 0→1 | 0→1 | 0→1 |
| v8 | 0 | 0 | 0 | 0 | 0 | 0 | 1 |
| v9 | 1 | 1 | 0 | 1 | 1 | 0 | 1 |

| TAB.2 | VNEG=GND | | | VNEG<GND | | | |
|---|---|---|---|---|---|---|---|
| OUT | GND | VDD | HiZ | GND | VDD | HiZ | VNEG |
| M1 | ON | ON/OFF | ON/OFF | OFF | OFF | OFF | ON→OFF |
| M2 | OFF | OFF/ON | OFF/ON | ON→OFF | ON→OFF | ON→OFF | OFF |
| M3 | ON | ON/OFF | ON/OFF | OFF | OFF | OFF | ON |
| M4 | OFF | OFF/ON | OFF/ON | ON | ON | ON | OFF |
| M5 | OFF | OFF/ON | OFF/ON | ON | ON | ON | OFF |
| M6 | ON | ON/OFF | ON/OFF | OFF | OFF | OFF | ON |
| M7 | ON | OFF | OFF | OFF→ON | OFF | OFF | ON |
| M8 | OFF | ON | OFF | OFF | ON | OFF | OFF |

*Fig. 4*

SWITCHING CIRCUIT WITH AN OUTPUT VOLTAGE CHANGING AMONG FOUR POSSIBLE VALUES

TECHNICAL FIELD

The present invention relates to a switching circuit able to provide at the output OUT a supply voltage $V_{DD}$, a reference voltage (ground=GND), a high impedance (Hi Z) or a voltage $V_{NEG}$ which can be a negative voltage or ground.

BACKGROUND OF THE INVENTION

In EEPROM or Flash EEPROM non-volatile memory devices, it is possible electrically to write, to read and to erase the elementary memory cells which constitute them: particularly, the erasure of the Flash EEPROM memories consists of an operation that lowers the threshold voltage value of the memory cells, extracting the negative charge stored in the floating gate.

Such an erasing operation can be performed by means of a technique wherein the source electrode of the memory cells is carried to a voltage level near the supply voltage and a negative voltage is applied to the control gate electrode, always keeping not connected the drain electrode.

The management of the voltage negative values in a circuit manufactured in CMOS technology can be difficult, because it can be not possible to apply negative voltages with suitable values to the source or drain electrodes of the N channel MOSFET, without forward biasing the source/substrate or drain/substrate junctions, the substrate of the integrated circuit being rigidly connected to ground.

Such a problem is solved using a CMOS technology which allows to insulate the bulk electrode of the N channel MOSFET transistors from the device substrate, necessarily connected to ground.

FIG. 1 shows, for example, the section view of a N channel MOS transistor manufactured in triple well technology, and FIG. 2 shows the circuit symbol which represents such transistor. In FIG. 1 there is a P type deep substrate 1 connected to ground, wherein a N type well 2 is obtained and it is connected to the supply voltage $V_{DD}$; inside it there is another P type well 3 with two N+ doped zones corresponding to the drain and source electrodes; the well 3 electrode is connected to the source electrode. The substrate 1 and the wells 2 and 3 are connected to their external electrodes through contact regions which have a higher doping.

By means of this triple well technology the N channel MOSFET has such N well 2 that by applying positive supply voltage $V_{DD}$ to this well it is possible to inversely bias all the parasitic junctions existing inside the structure, even when negative voltages are applied to the source electrode, connected to the bulk electrode 3 of the same transistor.

It is necessary, then, that inside the Flash EEPROM memory there are switching circuits able to supply out voltage values equal to supply voltage, to negative voltage, to ground or with the output node floating in high impedance, in order to allow the right control of all the analogue circuitry, said switching circuits being controlled by digital signals switching between ground and supply voltage.

SUMMARY OF THE INVENTION

In view of the state of the art described, it has been an object of the present invention that of providing a switching circuit able to supply out a voltage which can be alternatively equal to supply voltage, to a negative voltage, to ground or which has the output node floating in high impedance, without meeting the above-mentioned problems.

According to the present invention, such an object is achieved by means of a switching circuit comprising a reference voltage, an input voltage, suitable to assume alternatively a negative value or a value equal to said reference voltage, an output node, characterized in that said output node is suitable to assume selectively three possible voltage values equal to a supply voltage, to said reference voltage, to said input voltage or, alternatively, to be kept floating, at high impedance, in response to a first, a second, a third, a fourth, a fifth, a sixth control logic signal, switching between said supply voltage and said reference voltage, comprising a first transistor, with a first electrode controlled by said first control logic signal, a second electrode corresponding to a first node and with the control electrode connected to said reference voltage, a second transistor, with a first electrode controlled by said second control logic signal, a second electrode corresponding to a second node and with the control electrode connected to said reference voltage, a third transistor, with a first electrode controlled by said fifth control logic signal, a second electrode connected to said first node and the control electrode connected to said second node, a fourth transistor, with a first electrode controlled by said fifth control logic signal, a second electrode connected to said second node and the control electrode connected to said first node, a fifth transistor, with a first electrode connected to said input voltage, a second electrode connected to said first node and the control electrode connected to said second node, a sixth transistor, with a first electrode connected to said input voltage, a second electrode connected to said second node and the control electrode connected to said first node, a seventh transistor, with a first electrode connected to said output node, a second electrode connected to said second node and the control electrode connected to said fourth control logic signal, an eighth transistor, with a first electrode connected to said output node, a second electrode connected to said third control logic signal and the control electrode connected to said sixth control logic signal.

BRIEF DESCRIPTION OF THE DRAWINGS

The features and advantages of the invention will be made apparent by the following detailed description of one embodiment thereof, illustrated as non-limiting example in the annexed drawings, wherein:

FIG. 4 comprises tables 1 and 2, where table 1 represents the values of the control signals v1–v9 at every possible value of the output signal OUT, in the two situations wherein $V_{NEG}$ is ground ($V_{NEG}$=GND) or a negative voltage ($V_{NEG}$<GND), and table 2 shows the on/off conditions of the transistors M1–M8 in the circuit, at every possible value of the output signal OUT.

DETAILED DESCRIPTION OF THE INVENTION

Figure 1:
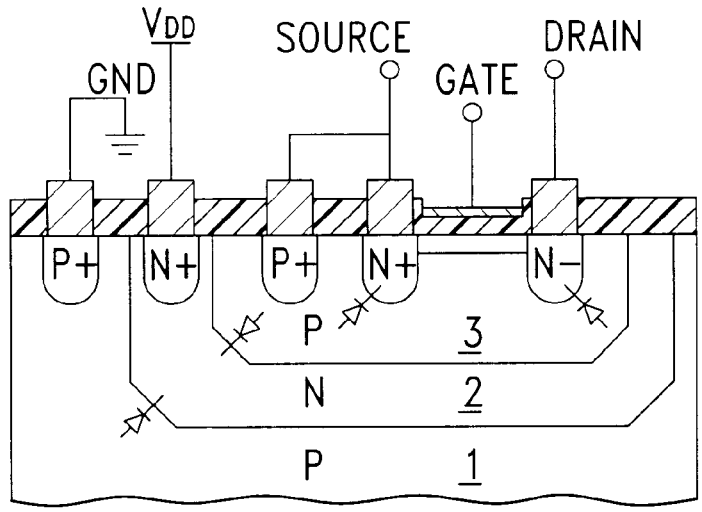
FIG. 1 and 2 show respectively the section view and the circuit symbol of a N channel MOS transistor manufactured in triple well technology, usable in an embodiment of the present invention.
Figure 2:
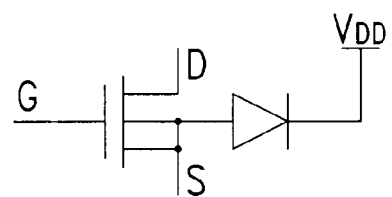
Figure 3:
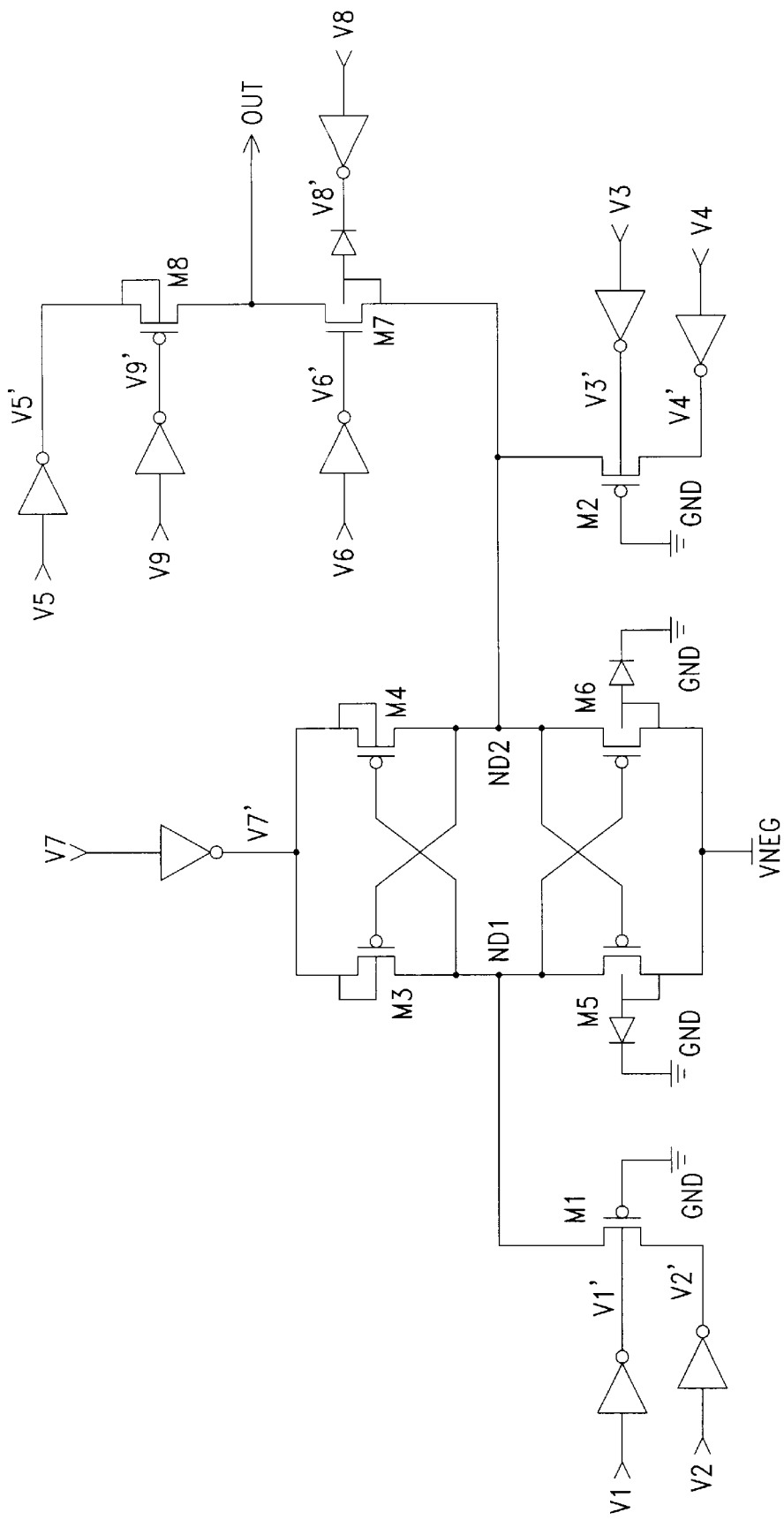
FIG. 3 is a circuit diagram of a switching circuit according to an embodiment of the present invention.

FIG. 3 shows a circuit diagram of a switching circuit according to an embodiment of the present invention; such circuit receives nine control signals, v1, v2, v3, v4, v5, v6, v7, v8, v9, it supplies out a voltage signal OUT, it is connected between a supply voltage $V_{DD}$ and a reference voltage (ground=GND), and moreover it receives as an input a voltage $V_{NEG}$ which can be a negative one or ground. The control signals v1, v2, v3, v4, v5, v6, v7, v8, v9, can assume the high digital value (supply voltage $V_{DD}$) or the low one (reference voltage GND).

A part of the circuit has a symmetrical structure and comprises a couple of P channel MOSFET, M3 and M4, with the common source electrode controlled by the control signal v7, the control signal of the MOSFET M4 connected, through the node ND1, to the drain electrode of the MOSFET M3 and, on the contrary, the control electrode of the MOSFET M3 connected, through the node ND2, to the drain electrode of the MOSFET M4, in order to form a first "latch" structure. The n-wells of both transistors are connected to their source electrodes.

The circuit comprises a couple of N channel MOSFET, M5 and M6, manufactured in triple well technology, with the common source electrode connected to the voltage $V_{NEG}$, the control electrode of the MOSFET M6 connected, together with the drain electrode of the MOSFET M5, to the node ND1 and, symmetrically, the control electrode of the MOSFET M5 connected, together with the drain electrode of the MOSFET M6, to the node ND2. The n-wells of the two MOSFET M5 and M6 are connected to the reference voltage.

Also another P channel MOSFET, M1, is connected, through a first electrode, to the node ND1, with a second electrode controlled by the control signal v2, with the control electrode connected to the reference voltage, and with the n-well controlled by the control signal v1.

Symmetrically, also another P channel MOSFET, M2, is connected, through a first electrode, to the node ND2, with a second electrode controlled by the control signal v4, with the control electrode connected to the reference voltage, and with the n-well controlled by the control signal v3.

A further N channel MOSFET, M7, is connected, through a first electrode, to the node ND2, manufactured in triple well technology, with a second electrode connected to the output OUT, the control electrode controlled by the control signal v6, and the n-well controlled by the control signal v8.

A last P channel MOSFET, M8, has a first electrode connected to the output OUT, a second electrode, connected to the n-well, controlled by the control signal v5, and the control electrode controlled by the control signal v9.

All the nine control signals v1–v9 interact with the circuit each one through its inverter, so that the circuit is controlled by the complementary logic signal V1'–V9' of the control signals.

It can be analyzed in detail the working of such a circuit.

The analysis must be divided in two separated cases, each one depending on the value assumed by the voltage $V_{NEG}$: in the first case the voltage $V_{NEG}$ is ground, whereas in the second case it assumes a negative value.

Table 1 in FIG. 4 shows the values of the control signals v1–v9 for every possible value of the output signal OUT, in the two situations wherein $V_{NEG}$ is ground ($V_{NEG}$=GND) or a negative voltage ($V_{NEG}$<GND). The digital values 0 (low) and 1 (high) correspond to the voltage values GND and $V_{DD}$, respectively. The case in which there are both the logic values (1/0 or 0/1) means that the corresponding control signal can assume anyone of its possible values without affecting the output signal OUT: for a correct working of the latch structure, in case of $V_{NEG}$=GND, when the control signal v2 is low, the signal v4 must be high and vice versa. The presence of situations wherein the symbol 0→1 appears means that the related control signal must to change from the situation of low logic value (GND) to that of high logic value ($V_{DD}$).

Table 2 in FIG. 4 shows the on/off conditions of the transistors M1–M8 present in the circuit, at every possible value of the output signal OUT. There are cases wherein a transistor can be indifferently on or off (ON/OFF or OFF/ON) and cases wherein there is a transfer from a situation to the other and vice versa (ON→OFF or OFF→ON). For a correct working of the circuit in case of $V_{NEG}$=GND and output OUT=$V_{DD}$, the on/off conditions of the transistors M1–M6 must be however in relationship with each other and then only two different situations are possible, one in which M1, M3, M6 are on and M2, M4, M5 are off and the opposite case in which M1, M3, M6 are off and M2, M4, M5 are on; likewise even when OUT=Hi Z the on/off conditions are correlated and then also in this case there are two complementary conditions, one in which M1, M3, M6 are on and M2, M4, M5 are off and the opposite case in which M1, M3, M6 are off and M2, M4, M5 are on.

In the situation wherein the voltage $V_{NEG}$ is ground ($V_{NEG}$=GND), the output OUT can assume three different voltage values:

1. OUT=GND. Ground is carried to output OUT through a path formed by the two transistors M6 and M7, both on, from the voltage $V_{NEG}$ (ground).

2. OUT=$V_{DD}$. The supply voltage is transferred to the output OUT through the transistor M8 on. Since the transistor M7 is off, the output OUT is disconnected from the node ND2 and then the latch constituted by the transistors M3 and M6 can be unbalanced in any way.

3. OUT=Hi Z. For carrying the output in high impedance, i.e., floating, both transistors M7 and M8 are off, and as in the previous case the latch constituted by transistors M3 and M6 can be unbalanced in any way.

In case that the voltage $V_{NEG}$ assumes a negative value ($V_{NEG}$<GND), the output OUT can assume four different voltage values:

4. OUT=GND. In this case the ground is transferred to the output OUT through the path constituted by the transistors M4 and M7; in fact, the MOSFET M4 is on due to the fact that its gate electrode carries a negative voltage, the transistor M5 being on. Before the final configuration, which allows the passage of the ground, it is necessary to reverse the latches, constituted by transistors M3–M4 and M5–M6, to the proper part, so that the ground can be transferred: this requires the switches indicated in the tables with the symbol →.

5. OUT=$V_{DD}$. The supply voltage $V_{DD}$ is transferred to the output OUT through the transistor M8 on. Also in this case the output OUT is disconnected from the node ND2, by means of transistor M7 which is off.

6. OUT=Hi Z. In this case both transistors M7 and M8 are off, and the output OUT is then carried in high impedance.

7. OUT=$V_{NEG}$. The negative voltage $V_{NEG}$ is carried to the output OUT through the path constituted by the transistors M6 and M7 which are on. Referring to transistors M1 to M6, the situation is symmetrical in respect to that described at point 4, and so the same above-mentioned considerations continue to be valid. The control signal v6 could be also at low logic level (0) instead of high (1): the advantage of putting it at high logic level is for reducing the voltage across the M7 transistor oxide in an amount equal to the supply voltage $V_{DD}$.

In the examined circuit, the control signal v8 is useful for reducing the stress to which the n-well/p-well junction of the transistor M7 is subjected, while the control signals v1 and v3 are used for reducing the stress on the n-well/source and n-well/drain junctions of the transistors M1 and M2, respectively: without this advantage, the circuit can be simplified by keeping ground the signals v1, v3 and v8.

A feature of this circuit is the low stress to which all the present transistor are subjected: in fact, the maximum potential difference applied to all the oxides (and then the potential difference gate/source, gate/drain, gate/n-well, gate/substrate, gate/p-well) and to all the junctions (source/substrate, drain/substrate, source/n-well, source/p-well, drain/p-well, drain/n-well, n-well/substrate, n-well/p-well) of all the transistors, both N channel and P channel, is equal to the voltage $V_{NEG}$ modulus.

What is claimed is:

1. A switching circuit, comprising: a reference voltage, an input voltage, suitable to assume alternatively a negative value or a value equal to said reference voltage, an output node, characterized in that said output node is suitable to assume selectively three possible voltage values equal to a supply voltage, to said reference voltage, to said input voltage or, alternatively, to be kept floating, at high impedance, in response to a first, a second, a third, a fourth, a fifth, a sixth control logic signal, switching between said supply voltage and said reference voltage, comprising a first transistor, with a first electrode controlled by said first control logic signal, a second electrode corresponding to a first node and with the control electrode connected to said reference voltage, a second transistor, with a first electrode controlled by said second control logic signal, a second electrode corresponding to a second node and with the control electrode connected to said reference voltage, a third transistor, with a first electrode controlled by said fifth control logic signal, a second electrode connected to said first node and the control electrode connected to said second node, a fourth transistor, with a first electrode controlled by said fifth control logic signal, a second electrode connected to said second node and the control electrode connected to said first node, a fifth transistor, with a first electrode connected to said input voltage, a second electrode connected to said first node and the control electrode connected to said second node, a sixth transistor, with a first electrode connected to said input voltage, a second electrode connected to said second node and the control electrode connected to said first node, a seventh transistor, with a first electrode connected to said output node, a second electrode connected to said second node and the control electrode connected to said fourth control logic signal, an eighth transistor, with a first electrode connected to said output node, a second electrode connected to said third control logic signal and the control electrode connected to said sixth control logic signal.

2. Circuit according to claim 1, characterized in that said first, second, third, fourth and eighth transistors are P channel MOSFET, and said fifth, sixth and seventh transistors are N channel MOSFET.

3. Circuit according to claim 2, characterized in that said fifth, sixth and seventh transistors are manufactured in triple well technology, and said third and fourth transistors have the n-well controlled by said fifth control logic signal, and said eighth transistor has the n-well controlled by said third control logic signal.

4. Circuit according to claim 3, characterized by comprising a seventh, an eighth and a ninth control logic signal, said seventh control signal controlling the n-well of said first transistor, said eighth control logic signal controlling the n-well of said second transistor, and said ninth control logic signal controlling the n-well of said seventh transistor, so that the maximum potential difference applied to all the oxides and junctions of all the transistors is equal to the modulus of the negative value of the input voltage.

5. A switching circuit, comprising:
   a first latch having a first terminal connected to a first control logic signal, a second terminal connected to a first node, and a third terminal connected to a second node;
   a second latch having a first terminal connected to an input voltage terminal, a second terminal connected to the first node, and a third terminal connected to the second node;
   a first switch having a first terminal connected to the first node, a second terminal connected to a second control logic signal, and a control terminal connected to a reference voltage;
   a second switch having a first terminal connected to the second node, a second terminal connected to a third control line signal, and a control terminal connected to the reference voltage;
   a third switch interposed between an output terminal and the second node, the third switch having a control terminal connected to a fourth control line signal; and
   a fourth switch having a first terminal connected to the output terminal, a second terminal connected to a voltage source, and a control terminal connected to a fifth control logic signal;
   the first and second latches and the first, second, third, and fourth switches being responsive to the first, second, third, and fourth control logic signals to selectively connect the output terminal to one of either a high impedance node, a first voltage level, and the reference voltage.

6. The circuit of claim 5 wherein the input voltage terminal is connected to the reference voltage.

7. The circuit of claim 6 wherein the third switch disconnects the output terminal from the second node when the fourth switch connects the output terminal to the voltage source.

8. The circuit of claim 6 wherein the fourth switch disconnects the output terminal from the voltage source when the third switch connects the output terminal to the second node.

9. The circuit of claim 6 wherein the third switch disconnects the output terminal from the second node and the fourth switch disconnects the output terminal from the voltage source to connect the output terminal to a high impedance node.

10. The switching circuit of claim 5 wherein the input voltage terminal is connected to a negative voltage source that is negative with respect to the reference voltage.

11. The circuit of claim 10 wherein the third switch disconnects the output terminal from the second node when the fourth switch connects the output terminal to the voltage source.

12. The circuit of claim 10 wherein the fourth switch disconnects the output terminal from the voltage source and, the third switch connects the output terminal to the second node when the second latch connects the second node to the input voltage terminal to thereby connect the output voltage terminal to the negative voltage source.

13. The circuit of claim 5 wherein the first, second, third, and fourth switches comprise MOS transistors having n-well body terminals, the circuit further comprising sixth, seventh, and eighth control lines connected to the first, second, and third transistor n-well body terminals so that the maximum potential difference applied to all oxides and junctions of all transistors is equal to the modulus value of the negative value of an input voltage on the input voltage terminal.

14. A switch circuit, comprising:

first, second, third, fourth, and fifth control inputs;

a latch circuit having a first node, a second node, a supply voltage terminal selectively connectable to the first control input and a reference voltage terminal selectively connectable to a first voltage line;

a first transistor having a first terminal connected to the second control input, a second terminal connected to the first node, and a control terminal connected to ground;

a second transistor having a first terminal connected to the third control input, a second terminal connected to the second node, and a control terminal connected to ground;

a third transistor having a first terminal connected to the second node, a second terminal connected to an output, and a control terminal connected to the fourth control input; and a fourth transistor having a first terminal connected to a supply voltage, a second terminal connected to the output, and a control terminal connected to the fifth control input;

the latch circuit, and the first, second, third, and fourth transistors configured to respond to the first, second, third, fourth, and fifth control inputs to selectively couple the output to one of either the supply voltage, the first voltage line, ground, and in a high-impedance state.

15. The circuit of claim 14 wherein the latch circuit and the first, second, third, and fourth transistors are configured to:

(a) couple the output to ground when the first voltage line is connected to ground and the latch circuit is disconnected from the first control input and connected to the first voltage line, and when the first and third transistors are on and the second and fourth transistors are off;

(b) connect the output to the supply voltage when the third transistor is off and the fourth transistor is on; and (c) disconnect the output to be in a high-impedance state when the third and fourth transistors are off.

16. The circuit of claim 14 wherein the latch circuit and the first, second, third, and fourth transistors are configured to:

(a) connect the output to ground when the first control input is switching from a zero logic state to a one logic state and the first voltage line is connected to a negative voltage, and the first and fourth transistors are off, the second transistor is on, and the third transistor is switching from off to on;

(b) connect the output to the supply voltage when the third transistor is off and the fourth transistor is on;

(c) disconnect the output and place it in a high-impedance condition when the third and fourth transistors are off; and (d) connect the output to the first voltage line when the latch circuit is disconnected from the first control input and connected to the first voltage line and the second and fourth transistors are off, the third transistor is on, and the first transistor is switching from an on condition to an off condition.

* * * * *